(12) United States Patent
Narisawa et al.

(10) Patent No.: US 6,572,917 B2
(45) Date of Patent: Jun. 3, 2003

(54) MANUFACTURING METHOD OF MAGNETIC MEMORY DEVICE

(75) Inventors: Hiroaki Narisawa, Miyagi (JP); Keitaro Endo, Miyagi (JP); Shinya Kubo, Miyagi (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 10/189,821

(22) Filed: Jul. 3, 2002

(65) Prior Publication Data

US 2003/0026894 A1 Feb. 6, 2003

(30) Foreign Application Priority Data

Jul. 13, 2001 (JP) ........................................ 2001-213438

(51) Int. Cl.[7] ................................................ B05D 5/12
(52) U.S. Cl. ...................... 427/130; 427/131; 427/132; 427/259; 427/264; 427/265; 427/270; 427/272; 427/282; 427/331; 427/404
(58) Field of Search ................................. 427/130, 131, 427/132, 259, 264, 265, 270, 272, 282, 331, 404

Primary Examiner—Bernard Pianalto
(74) Attorney, Agent, or Firm—Sonnenschein, Nath & Rosenthal

(57) ABSTRACT

A manufacturing method of a magnetic memory device, wherein the inventive method does not require any special technique for forming pattern, but bilaterally ensures precision for processing a tunnel magneto-resistive effect element (called TMR element) and self-matching formation of connecting elements. The manufacturing method of a magnetic memory device comprises a processing step of forming a tunnel magneto-resistive effect film sandwiching a tunnel barrier layer between a magnetic pinned layer and a memory layer into a predetermined elementary configuration by applying a mask layer, wherein the mask layer is formed by applying a plating process.

4 Claims, 4 Drawing Sheets

MANUFACTURING METHOD OF MAGNETIC MEMORY DEVICE

RELATED APPLICATIONS

The present document is based on Japanese Priority Document JP 2001-213438, filed in the Japanese Patent Office on Jul.13, 2001, the entire contents of which being incorporated herein by reference.

BACKGROUND OF THE INVENTION

1. Field of the Invention

The present invention relates to a manufacturing method of a magnetic memory device. More particularly, the present invention relates to a manufacturing method of a magnetic memory device utilizing a TMR (Tunnel Magneto-Resistive) film.

2. Description of the Related Art

Along with rapid growth of information communicating apparatuses, particularly in the field of personal-use down-sized communication apparatuses such as a PDA (Personal Digital Assistant), higher integration, faster speed, and lower power consumption are demanded against memory elements and logic elements available for constituting these communicating apparatuses. In particular, realization of higher density and greater capacity of non-volatile memories has become a more important issue for the art of replacing such a hard disk or an optical disk which is intrinsically unable to be down-sized due to presence of moving elements.

There is a flash memory based on a semiconductor technology and a FRAM Ferro-electric Random Access Memory) base on a ferro-dielectric technology as such non-volatile memories, for example. Nevertheless, a flash memory still has a problem to solve in that a writing speed still remains in the order of micro-seconds. On the other hand, a FRAM also still has a problem to solve in that re-writable rounds are still insufficient.

A magnetic memory called a MRAM (Magnetic Random Access Memory) described in the IEEE Trans. Magn. 33 (1997), Page 4498, by Wang et al., draws attention as a non-volatile memory which is free from the above-referred problems, and due to the result of improvement in physical characteristics of a TMR (Tunnel Magneto-Resistive) material in recent years, the MRAM memory has drawn attention in this field.

Because of its simple constitution, the MRAM memory can readily be formed into highly integrated configuration. Inasmuch as the MRAM memory executes recording by rotation of magnetic moment, it is possible to secure sufficient re-writable rounds. Further, it is expected that the MRAM memory can execute accessing operation at an extremely high speed rate. Actually, it is already confirmed that the MRAM memory operates itself in order of nano-seconds.

As described above, the MRAM memory advantageously facilitates its own high-integration. However, in the case of actually embodying it, a micro forming fabrication of the above-referred TMR elements is extremely important. Variation of resistance is caused by a tunnel phenomenon generated in an extremely thin insulating film representing aluminum oxide sandwiched by ferro-magnetic elements. Normally, such extremely thin insulating film has a maximum of 1nm in thickness. In the event that a metal film adheres to the side of an insulating film, a leakage path is formed, and accordingly, the change of the resistance is lowered significantly. Therefore, it is quite essential to secure such a processing technology to prevent a metal film from re-ahering itself to the side of the insulating film. As to the connection of the TMR elements and the signal wiring (bit line), it is preferred to use a self-alignment type forming technology for the connecting holes. There are proposed following conventional methods in forming the above mentioned TMR elements.

A first manufacturing method utilizes a lift-off method. This technology is widely used for forming an abut junction of a thin-film magnetic head available for a hard disk drive. Using photo-resist for mask material in forming elements, this method continuously executes an etching process and a film-forming process, and then removes the formed film material on the photo-resist in conjunction with the resist. This method features an advantage to form connecting holes by a self-alignment technology.

A second manufacturing method is conventionally available by those steps including; a step of processing a TMR element, a step of forming a film of insulating material and a final step of forming connecting holes by an RIE (Reactive Ion Etching) process with the resist as a mask.

A third manufacturing method executes those steps including the following. Initially, this method forms a metal film by a sputtering process, where the metal film becomes a plug on a TMR film, followed by a step of leveling off the metal film by a lithographic process, followed by a step of forming an insulating film, and execution of a chemical-mechanical polishing process. This method enables the forming of connecting holes by the self-alignment processing.

As described above, it is quite difficult to compatibly secure processing precision and the forming of connecting holes by self-alignment processing, and yet, it is urged to achieve both objectives.

Nevertheless, in order to realize selective film forming by the lift-off process corresponding to the first method, as shown in FIG. 7, it is required to separate a formed film 721 at an end portion of a resist pattern 711. To achieve this, it is essential to introduce a special pattern-forming technology for forming an undercut on a bottom side of the resist pattern 711. This means that, along with further fining of film configuration, contact areas of the resist and a substrate become narrower than that predetermined by a design rule, and thus, it is expected that preservation of a film configuration will become extremely difficult.

In the case of executing the second method, as described earlier, it is required to properly set margin upon consideration of the alignment between elements and connecting holes and dimensional variation, thus obstructing contraction of the design rule.

Further when executing the third method, it is essential to process a plug. However, this process causes precision in the processing of a TMR element, in other words, this process causes extreme declination of precision of the processed form and processed depth.

SUMMARY OF THE INVENTION

In order to fully solve the above problems, the present invention provides a novel manufacturing method of a magnetic memory device.

The manufacturing method of a magnetic memory device of the present invention, the manufacturing method comprises a step of processing a magneto-resistive effect film comprising a tunnel barrier layer arranged between a magnetic pinned layer and a memory layer into a predetermined form of an element using a mask layer having a predetermined form of an element, wherein the mask layer is formed by a plating method.

Namely, after forming a foundation layer, a TMR (Tunnel Magneto-Resistive) effect film, a top-coating layer, and a plate-foundation layer sequentially on a substrate, a resist film having an aperture portion of the same shape as predetermined form of an element is formed on the plate foundation layer. Next, by applying a plating method, a plated layer is formed by selectively growing the resist layer on the plate foundation layer inside of the aperture portion. Next, after removing the resist layer, a set of processing is applied from the plate foundation layer up to the memory layer of the magneto-resistive effect film using the plated layer as a mask layer to form a TMR (Tunnel Magneto-Resistive) element.

In the manufacturing method of the above-mentioned magnetic memory device, a plated layer is formed by selectively growing within the aperture portion formed at the resist film by plating method, then a TMR element is formed with the plated layer as a mask layer, so that it is possible to form a self-aligned contact by connecting a word writing line to the above-mentioned plated layer, because the connection of the TMR element and the word writing line can be done through the plated layer.

Further, according to the manufacturing method of the present invention, a special form of resist for the lift-off process is not necessary, it is possible to form a still finer TMR element.

Further, after the aperture portion is formed at the resist, the plated layer which becomes a connection portion is formed utilizing the aperture portion by a plating method, so that an application of a hole miniaturizing technology becomes possible, and further a forming of an aperture portion having such a dimension below critical limit of resolution of a photolithography machine becomes possible, thereby it is possible to form a TMR element having such a dimension below critical limit of resolution.

Further, by way of forming a mask layer with a conductor such as metal, for example, by a selective plating method, it is possible to form a mask layer with high resistance against etching effect, and thus, controllability of the configuration and etching depth are respectively improved.

According to the manufacturing method of the magnetic memory, when connecting the TMR element to the word writing line, it is possible to form such a self-aligning connecting hole. Further, the method of the present invention does not require a special form of resist for the lift-off process, it is possible to form a finer TMR element. Further, the method makes it possible to apply such a hole-miniaturizing technique and form a TVR element having a dimension below critical limit of resolution of any photolithography apparatus. Further, based on a selective plating method, a plated layer made from metal is formed and then utilizes the formed plated layer to serve as the mask layer. As a result, it is possible to improve controllability on the form and the etching depth as well. By virtue of the arrangement and practical effect of the present invention, it is possible to form finer elements, and yet, improve degree of integrating MRAMs.

DESCRIPTION OF THE PREFERRED EMBODIMENTS

First, by referring to a simplified schematic perspective view shown in FIG. 2, art of the configuration of a conventional MRAM (Magnetic Random Access emory) is described below. Reading circuit is omitted from FIG. 2.

Figure 2:
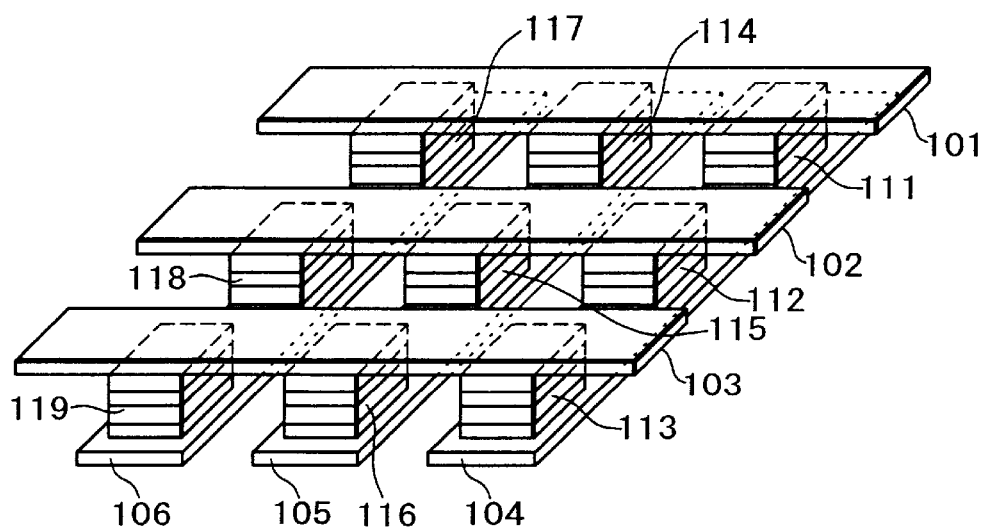
FIG. 2 schematically designates a perspective view of a partly simplified configuration of a MRAM.

As shown in FIG. 2, the exemplified MRAM comprises 9 units of memory cells, here each memory cell incorporates mutually intersecting bit writing lines 101, 102, and 103, and word writing lines 104, 105, and 106. A plurality of tunnel magneto-resistive effect elements (TMR) 111~119 are individually disposed at individual intersections of the word writing lines. Each of the TMR elements contains an information memory layer containing such magnetic substance comprising nickel iron, cobalt, or alloy of at least two or more than two kinds of them. By changing magnetizing direction of the information memory layer in accordance with a magnetic field generated by writing current to be flown in a recording line, writing of information is executed. Generally, each of the writing lines is composed of electrically conductive metal material such as aluminum, or copper, or alloy of these, for example. Each of the writing lines is formed by selectively etching chemically or physically deposited electrically conductive metal material.

Next, by referring to the circuit diagram shown in FIG. 3, the principle circuit of the MRAM described by referring to FIG. 2 is described below.

Figure 1:
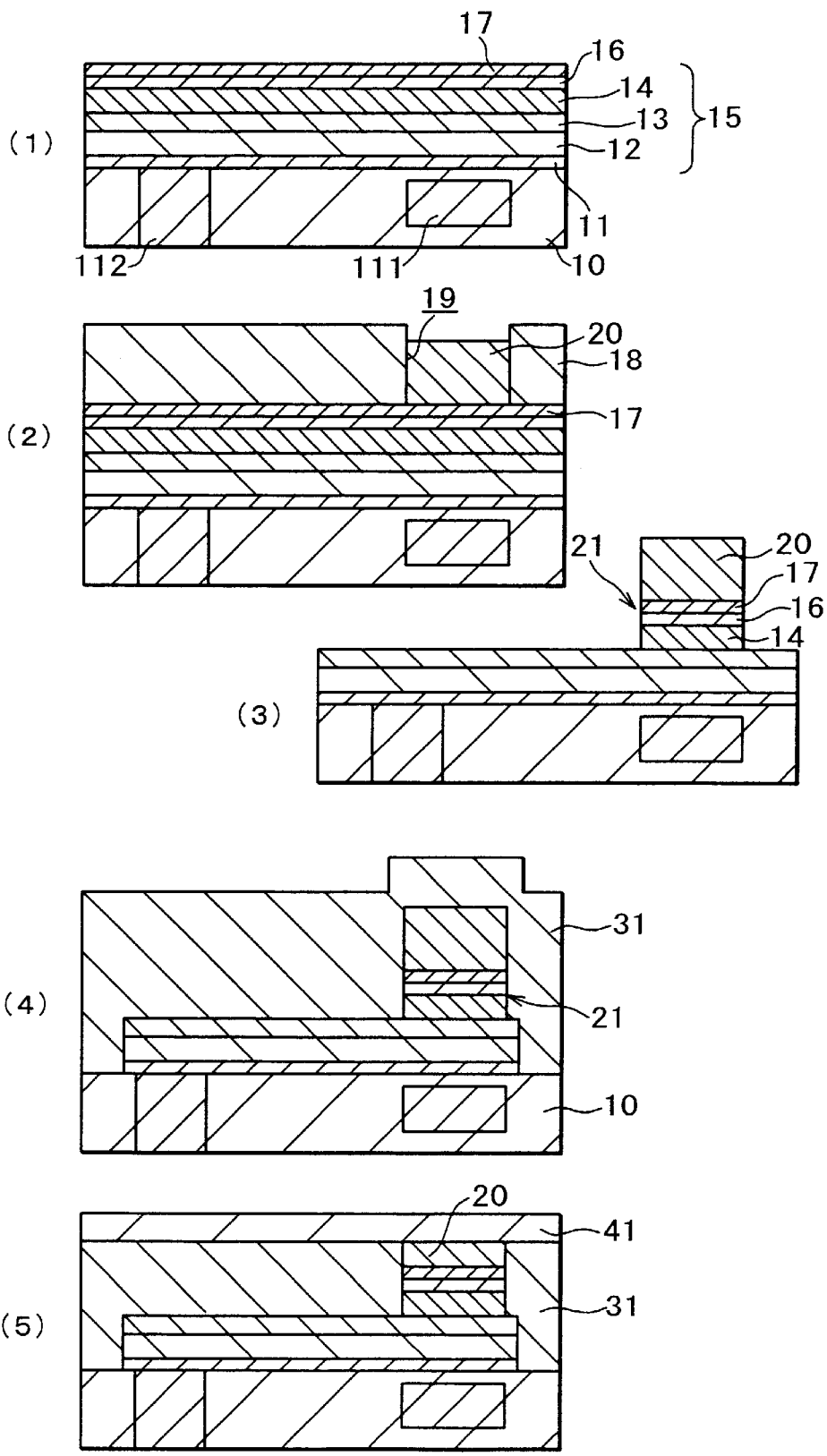
FIG. 1 (1)~(5) respectively designate schematic cross-sectional views of a first embodiment of the manufacturing method of a magnetic memory device according to the present invention.
Figure 3:
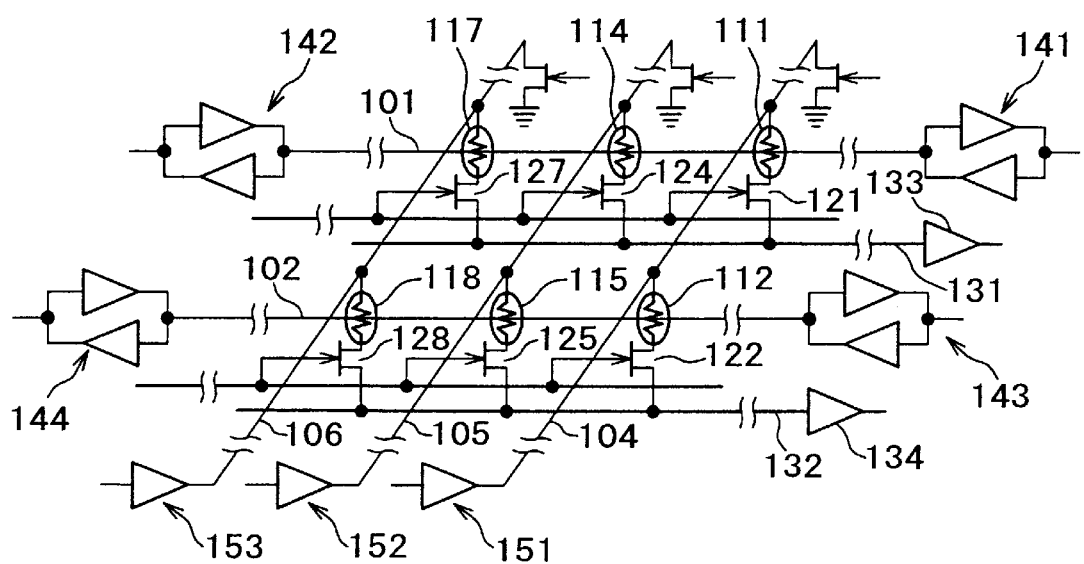
FIG. 3 schematically designates a circuit diagram of a principle circuit of the MRAM.

As shown in FIG. 3, the principle circuit of the MRAM contains 6 units of memory cells, and yet, it further comprises mutually intersecting word writing lines 104, 105, and 106 corresponding to these shown in FIG. 1, and a pair of bit writing lines 101 and 102. A plurality of TMR elements 111, 112, 114, 115, 117, and 118, each of which individually becomes a memory element, are arranged at the intersection of those word-writing lines. Further, in order to select a proper element at the time of reading, a number of field effect transistors 121, 122, 124, 125, 127, and 128 are connected to the corresponding memory elements. Further, a sense line 131 is connected to the field effect transistors 121, 124, and 127. Another sense line 132 is connected to the field effect transistors 122, 125, and 128.

The above-referred sense line 131 is connected to a sense amplifier 133, whereas the sense line 132 is connected to an another sense amplifier 134, whereby enabling them to detect information stored in the corresponding memory elements. A pair of bi-directional current sources 143 and 144 available for the word writing line are connected to both ends of the bit writing line 102. Another bi-directional current source 151 available for the word writing line is connected to the word writing line 104. Another bi-directional current source 152 available for the word writing line is connected to the word writing line 105. Further, another bi-directional current source 153 available for the word writing line is connected to the word writing line 106.

Next, referring to the cross-sectional view shown in FIG. 4, a cross sectional configuration of a single cell of the MRAM corresponding to the one shown in FIGS. 2 and 3 is described below.

Figure 4:
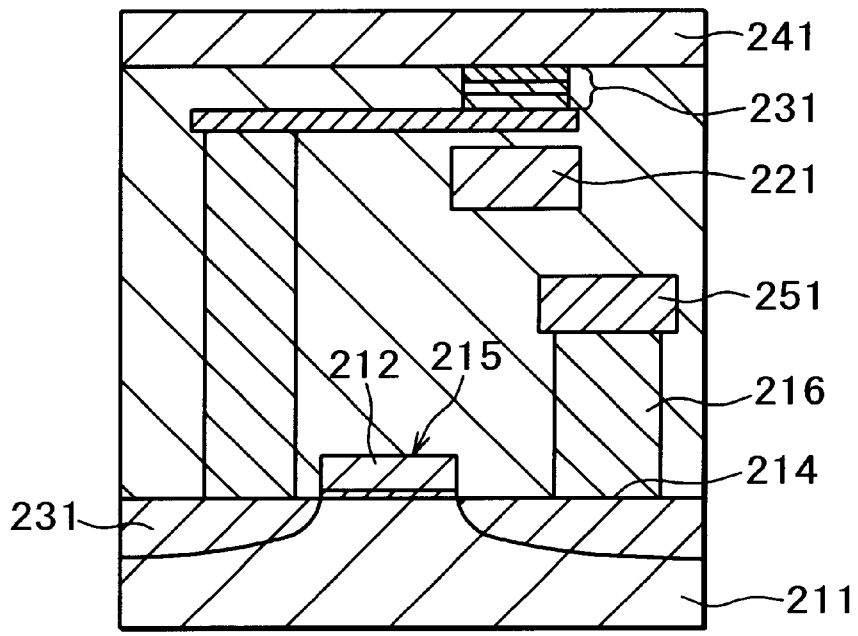
FIG. 4 schematically designates a cross-sectional view of a single cell of the MRAM.

As shown in FIG. 4, a field-effect transistor 215 comprising a gate area 212, a source area 213, and a drain area 214, is arranged on a semiconductor substrate 211. Further, a word writing line 221, a TMR element layer 231, and a bit writing line 241, are respectively arranged on the field effect transistor 215. Further, a sense line 251 is connected to the drain area 214 through a plug 216.

Next, referring to a schematic perspective view shown in FIG. 5, a configuration of the TMR film used for constructing a memory cell is described below.

Figure 5:
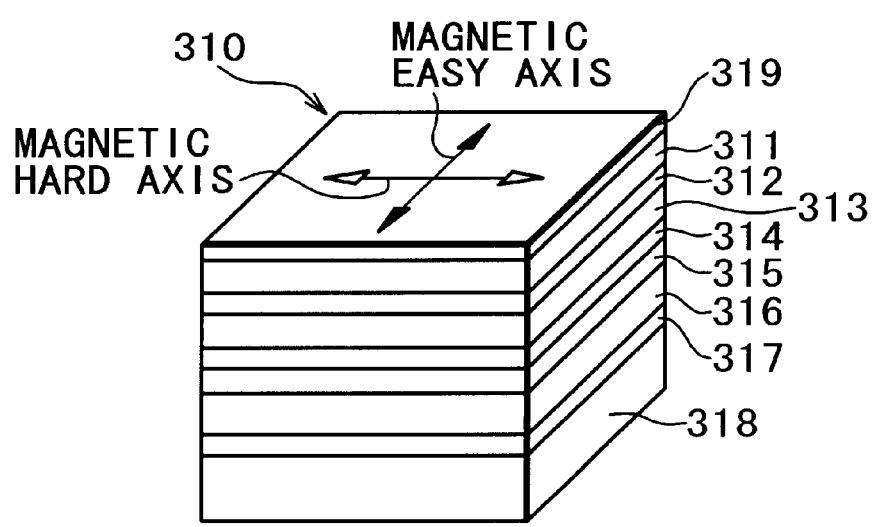
FIG. 5 schematically designates a perspective view of a TMR film to be used for a memory cell.

As shown in FIG. 5, the TMR film 310 comprises a memory layer 311 magnetization of which is easily rotated and a magnetic pinned layer. The magnetic pinned layer includes a first magnetic pinned layer 313 and a second magnetic pinned layer 315, and a conductive layer 314 is arranged between the first and second magnetic pinned layers 313 and 315 to enable both magnetized layers to be linked in anti-ferromagnetic relation. Any of those metals including ruthenium (Ru), copper (Cu), chromium (Cr), gold (Au), silver (Ag), or the like, may be used for constructing the above conductive layer 314.

The second magnetic pinned layer 315 is formed in contact with an anti-ferromagnetic layer 316. Due to interchanging action acting between layers of the second magnetic pinned layer 315 and the anti-ferromagnetic layer 316, the second magnetic pinned layer 315 becomes to have strong uni-directional anisotropic magnetic field. Manganese alloy of iron (Fe), nickel (Ni), platinum (Pt), iridium (Ir), rhodium (Rh) or the like or oxide of cobalt or nickel may be used for constructing the above anti-ferromagnetic layer 316.

A tunnel barrier layer 312 made of insulating layer comprising oxide or nitride of aluminum, magnesium, or silicon, is arranged between the memory layer 311 and the first magnetic pinned layer 313. The tunnel barrier layer 312 disconnects magnetic links between the memory layer 311 and the first magnetic pinned layer 313, and yet, it also functions to allow tunnel current to flow through it. Except for the tunnel barrier layer 312, all the above-referred films are formed by a sputtering process. The tunnel barrier layer 312 can be formed by oxidizing or nitriding the metal film formed by the sputtering process.

The memory cell comprising the above composition reads information by detecting variation of tunnel current of a magneto-resistive effect. However, resultant effect is dependent on the magnetizing direction relative to the memory cell and the magnetic pinned layer.

As shown in the drawings, the memory cell is arranged in the array of the MRAM at intersections of lattices comprising bit writing lines and word writing lines. In the case of the MRAM, by utllizng asteroid magnetization switching characteristics, it is very common to selectively write in respective memory cell through the word writing line and the bit writing line.

Mixed magnetization in a single memory area is determined by composition of vectors between a magnetic field $H_{EA}$ of magnetic easy axis and a magnetic field $H_{HA}$ of magnetic hard axis. Such current flowing through the bit writing line applies magnetic field ($H_{EA}$) of magnetic easy axis to the memory cells, whereas such current flowing through the word writing line adds the magnetic field ($H_{EA}$) of magnetic hard axis to the memory cells.

Figure 6:
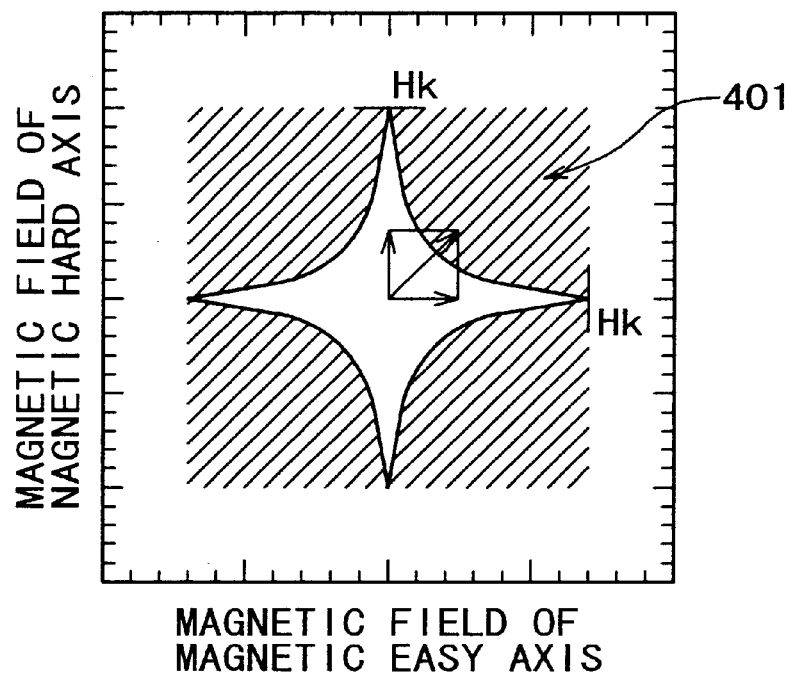
FIG. 6 graphically designates asteroid curves showing switching threshold values in the magnetizing direction of a memory layer generated in the magnetic field of a magnetic easy axis and the magnetic field of a magnetic hard axis.
Figure 7:
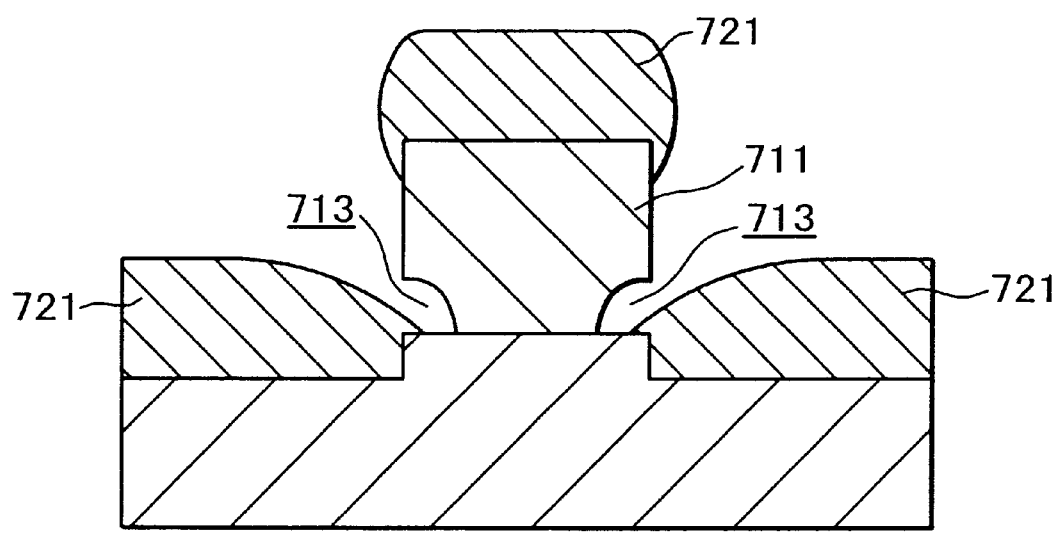
FIG. 7 schematically designates a cross-sectional view for explanatory of an example of existing technical problems.

The asteroid curves shown in FIG. 6 respectively designate threshold values in the magnetized direction of the memory layer switched by the applied magnetic field $H_{EA}$ of magnetic easy axis and the magnetic field $H_{HA}$ of magnetic hard axis. When such composition of the magnetic field vectors corresponding to an outside portion of the asteroid curves is generated, switching of magnetic field is occurred. On the other hand, such composition of magnetic field vectors corresponding to the inside portion of the asteroid curves does not switch memory cells from either side of bi-stable conditions of the current. Even in the case of such memory cells arranged at other than the intersections of such word writing line and bit writing line under the flow of current, a magnetic field solely generated by the word writing line or the bit writing line is applied to them, and accordingly, if the magnitude of the applied magnetic field exceeds an uni-directional switching magnetic field $H_K$, magnetize direction of such cells arranged at other than intersections is also switched, and thus, only in such a case where composition of magnetic fields is present in the obliquely shown portion 401, it is possible to selectively write into selected memory cells.

Conventional structure and operating principle during recording and reproducing modes of the MRAM are thus described. It should be understood however that the manufacturing method of the present invention relates to a method of forming element layers shown in FIG. 4 and a method of forming connecting holes for connecting to the bit writing line shown in FIG. 4. By solely limiting to both methods, practical manufacturing process after the process for forming a plug for connecting the bit writing line to the element layers shown in FIG. 4 is described below.

Referring now to the schematic cross-sectional views shown in FIG. 1, a first embodiment of the manufacturing method of the magnetic memory device of the present invention is described below. A general film structure is already described earlier by referring to FIG. 5. Five of schematic cross-sectional views shown in FIG. 1 respectively exemplify the layers comprising a plate foundation layer, a top coating layer, a memory layer, a tunnel barrier layer, a magnetic pinned layer, a foundation layer, and a supporting substrate, which are serially laminated from the top to the bottom.

As shown in FIG. 1 (1), initially, a foundation layer 11 is formed on a substrate formed with a semiconductor element (not shown), wiring 111, and a plug 112. Next, a magnetic pinned layer 12, a tunnel barrier layer 13, and a memory layer 14 are sequentially formed, whereby forming up a tunnel magneto-resistive effect (this is hereinafter called TMR) film 15. Next, a top-coating film 16 and a plate foundation layer 17 are sequentially formed. Each of the above Laminated films is formed by applying a sputtering process, for example. However, after forming a film by a sputtering process, the tunnel barrier layer 13 is formed by treating thus formed film with an oxidizing process. As a result of the above processes, the TMR film 15 is formed all over the surface of the substrate 10.

Next, as shown in FIG. 1 (2), by applying resist coating technology, a resist film 18 is formed on the plate foundation layer 17. Next, by applying lithographic technology, an aperture portion 19 identical to a shape of the TMR element is formed through the resist film 18. Next, by applying a plating method, electrically conductive material is selectively grown solely inside of the aperture portion 19 to form a plated layer 20. Copper (Cu) or copper alloy may be used for constructing the conductive material. In this case, copper is used for constructing the plate foundation layer 17, whereas tantalum nitride is used for constructing the tunnel barrier layer 13.

Alternatively, in the case of utilizing gold that should be buried by applying the plating method, gold is used for constructing the plate foundation layer 17, whereas titanium-tungsten is used for constructing the tunnel barrier layer 13, for example. It is already confirmed that titanium-tungsten alloy prevents diffusion otherwise caused by thermal treatment. Further, the plating material (conductive material) for forming above-mentioned plated layer 20 and the plate foundation layer 17 may be any metal material capable of plating process and having low-resistance (specific resistance corresponding to that of copper or gold, for example).

To implement the above plating method, electro-plating method is employed, for example. In the case of plating copper, for example, the substrate 10 and an anode (a copper sheet) are immersed in plating solution mainly composed of copper sulfate, in which the substrate 20 is connected to the negative pole to provide the anode with the positive potential to cause copper to be precipitated on the substrate 10 before eventually executing the plating process.

As described above, the above-referred selective plating method causes electrically conductive material to be grown selectively on the plate foundation layer 17 which is exposed to the bottom of the aperture portion 19 having such a shape corresponding to that of the TMR element formed through the resist film 18. Next, in order to improve a wetting property, a surface treatment is executed by applying oxygen plasma, for example. Next, by applying a mild etching process with mild-acidic solution for example, surface treatment is executed to remove oxidized film from the surface of the plate foundation layer 17. Next, by applying an electrolytic plating process, a copper film is selectively grown on the plate foundation layer 17.

After completing the electrolytic plating process, the resist film 18 is stripped off. In normal cases, the plate foundation layer 17 is removed by applying an ion-etching process whereby completing wiring process. In the practical aspect for embodying the present invention, the process to remove the plate foundation layer 17 is included in the process for forming a tunnel magneto-resistive element.

Next, as shown in FIG. 1 (3), by utilizing the plated layer 20 as the etching mask layer, an etching process is executed against the plate foundation layer 17, the top-coating layer 16, and the memory layer 14 before eventually forming up a TMR element 21.

The above etching process is executed by applying a physical etching by incidence of argon ion (concretely, by applying an ion-etching process or an ion-milling process, for example) or by applying a reactive ion etching process using fluorinated gas or chlorinated gas. In the case of etching metal material for constructing the TMR element, the above physical etching process used to be the main part sometime ago. However, in recent years, in order to meet the requirements for processing a thin film, introduction of the reactive etching process tends to increase.

As the etching speed is relatively slow, it is quite effective to utilize the plated layer 20 made of metal as a mask in the etching process.

More particularly, in such a bottom-type tunnel magneto-resistive effect film, such a process to complete the processing work at the time of forming the tunnel barrier layer (composed of aluminum oxide film) of the TMR element is assumed. Normally, when carrying on such a process for forming film all over the surface, reactive ion etching process is executed to a free layer (having 2 nm~5 nm in thickness), a cap layer (having 2 nm~5 nm in thickness), a tunnel barrier layer (having a few nm in thickness), and a metal mask layer (having approximately 0.5 $\mu$m~1.0 $\mu$m in thickness). After processing such metal films each having approximately 0.5 $\mu$m up to a maximum of 1.0 $\mu$m in thickness, it is required to complete the processing work inside of an aluminum oxide film having about 1 nm in thickness. Inasmuch as irregularity of the thickness of the formed film and irregularity of the etching result are incremental in proportion to film thickness, it is conceived that execution of the processing work inside of the above aluminum oxide film involves an extreme difficulty.

On the other hand, in the case of implementing the manufacturing method of the present invention, inasmuch as the free layer (having 2 nm~5 nm in thickness), the cap layer (having 2 nm~5 nm in thickness), the tunnel barrier layer (having a few nm in thickness) and the grounding layer (having 20 nm~50 nm in thickness) respectively constitute processing objects, it is allowable for the method to process such metal films each having a maximum of 100 nm in thickness and then suspend the etching process at the tunnel barrier layer 13. Accordingly, it is possible to terminate the processing work at a predetermined position inside of the tunnel barrier layer 13 throughout the entire surface of the substrate. Termination of the etching process can be recognized by monitoring light emitted at the etching terminating point.

Like the case of executing the reactive ion etching process, even when processing the metal films by applying the ion milling method, processed film is thinned off. This in turn advantageously facilitates the processing work.

As described above, the act of terminating the etching process inside of the tunnel barrier layer 13 enables to ignore re-deposition that may occur when argon ion is directly incident upon the tunnel barrier layer 13. Accordingly, the act of terminating the etching process inside of the tunnel barrier layer 13 is also applicable such a case in which degree of location is enhanced by condensing pattern density.

Next, by applying lithographic technology and etching technology, bypass wiring (not shown) is formed. Then, the resist film (not shown) used for the above-referred etching process is stripped off.

Next, as shown in FIG. 1 (4), by applying a sputtering process, for example, an insulating film 31 is formed to fully cover the above-referred TMR element 21 throughout the entire surface of the substrate 10. Inorganic insulating material such as silicon oxide or aluminum oxide, for example, is utilized to form the insulating film 31. Further, it is also possible to utilize organic insulating material such as polyalyl-ether resin, polyimide resin, or fluorinated resin, for example.

Next, as shown in FIG. 1 (5), a surface of the insulating film 31 is leveled off. In the actual experiment, the surface of the insulating film 31 is leveled off by applying a chemical mechanical polishing process. After leveling off the surface, the upper surface of the plated layer 20 is exposed to the surface of the insulating film 31. Next, a word writing line 41 connected to the plated layer 20 is formed on the insulating film 31. As a result, the plated layer 20 itself becomes a connector (plug) for interconnecting the TMR element 21 and the word writing line 41. The word writing line 41 can be formed by applying a conventional wiring forming technology. Thenceforth, although not shown, the word writing line 41 is connected to peripheral circuits, and yet, such a process for forming a passivation film is also executed.

The above mentioned manufacturing method of the present invention initially processes the TMR element 21 by utilizing the metal plating layer 20 for functioning as the mask layer, and then causes the upper surface (connecting surface) of the plated layer 20 to be exposed during the process for leveling off the insulating film 31. In proportion to precision of the chemical mechanical polishing process, it is essential to properly set film thickness of the plated layer 20 which becomes a mask layer when processing the TMR element 21. Considering precision of such a chemical-mechanical polishing process, it is essential to provide the plated layer 20 with a minimum of 500 nm in film thickness.

On the other hand, thickness ranging from the top-coating layer 16 of the TMR element 21 to the memory layer 14 is approximately less than 10 nm. In such a manufacturing method which suspends processing work at the tunnel barrier layer 13 (this method is suitable for preventing short-circuiting from occurring on the side surface of the tunnel-barrier layer 13), irregularity of processed effect in the metal-made mask layer becomes dominant, and thus, it is conceived that preservation of the processing -precision involves much difficulty. On the other hand, inasmuch as the manufacturing method utilizes such a selective plating method, by virtue of this method, only the film thickness of the plate foundation layer 17 is increased in the above processes. Inasmuch as it is possible to set film thickness of the plate foundation layer 17 to be less than approximately 50 nm, such adverse effect affecting the processing precision may substantially be ignored.

An example of such a process for contracting the aperture portion 19 formed through the resist film 18 into such a magnitude less than critical limit of resolution is described below.

In order to form such a magnetic resistance element that becomes a magnetic tunnel junction, the aperture portion 19 is formed through the resist film 18. Inasmuch as the aperture portion 10 is of such a shape approximating pattern of contact holes, it is possible to apply such a method titled as Resolution Enhancement Lithography Assisted by Chemical Shrink (the RELACS process).

Initially, by applying a conventional method, resist pattern is formed. Next, the above-referred RELACS process is executed. More particularly, initially, upper surface of resist pattern is coated with such chemical material specifically applicable to the RELACS process. Next, baking is executed to form a cross-linking layer on the surface of the resist pattern including the interior portion of the aperture. Next, excessive chemical material used for the RELACS process is removed. As a result, the aperture is contracted into such a dimension below the critical limit of image resolution of an exposure apparatus by such an amount corresponding to that of the formed cross-linking layer. Thenceforth, such serial processes similar to those processes described above to be executed after formation of resist pattern are serially executed.

According to the manufacturing method of the above-described magnetic memory device, initially, by applying a plating process, conductor (metal) is selectively grown inside of the aperture portion 19 formed through the resist pattern 18 before forming the plated layer 20. Next, by way of utilizing the plated layer 18 to function as a mask layer, the TMR element 21 is eventually formed. Further, by connecting the word writing line 41 to the plated layer, connection between the TMR element 21 and the word writing line 41 is implemented by the plated layer 20. In other words, self-matching connector is formed.

Further, inasmuch as the manufacturing method of the present invention does not require such a special resist form available for lift-off process, it is possible to form a still finer TMR element. Further, the method forms the aperture portion through the resist film 18, and yet, availing of the aperture portion 19, the plated layer 20 is formed by a plating process to enable the plated layer 20 to function as a connector element. Because of this arrangement, it has become possible to apply such a hole-contracting technique, whereby making it possible to form an aperture having such a dimension below critical limit of resolution of a conventional exposure apparatus. Accordingly, it is possible to form such a TMR element with such a dimension below critical limit of image resolution of any conventional exposure apparatus.

Based on a selective plating method, the inventive method forms the plated layer 21 comprising electrically conductive material such as metal for example, and then utilizes the plated layer 21 to function as the mask layer. As a result, it is possible to form such a mask layer incorporating highly resistant property against etching process, whereby improving controllability on the form and the etching depth.

What is claimed is:

1. A manufacturing method of a magnetic memory device comprising a processing step of forming a tunnel magneto-resistive effect film sandwiching a tunnel barrier layer between a magnetic pinned layer and a memory layer into a predetermined elementary form by applying a mask layer formed into an element form; wherein said mask layer is formed by a plating process.

2. The manufacturing method of a magnetic memory device according to claim 1, wherein a plate foundation layer is formed on a top-coating layer which is provided for protecting said tunnel magneto-resistive effect film.

3. The manufacturing method of forming a magnetic memory device according to claim 1, wherein said method comprising the steps of a processing step of, after forming a foundation layer on a substrate, forming a tunnel magneto-resistive effect film by serially forming a magnetic pinned layer, a tunnel barrier layer, and a memory layer, and further sequentially forming a top-coating layer and a plate foundation layer;

a processing step of, after forming a resist film on said plate foundation layer, forming an aperture portion having a shape identical to that of a shape of element through said resist film;

a processing step of forming a plated layer by selectively growing said plated layer on said plate foundation layer inside of said aperture portion by applying a plating process;

a processing step of, after removing said resist film, forming a tunnel magneto-resistive effect element by processing from said plate foundation layer up to said memory layer by utilizing said plated layer to serve as a mask layer;

a processing step of forming an insulating film for covering said tunnel magneto-resistive effect element together with said plated layer; and a processing step of leveling off the surface of said insulating film and exposing an upper surface of said plated layer at a surface of said insulating film.

4. A manufacturing method of forming a magnetic memory device comprising the steps of a processing step of forming a foundation layer on a substrate;

a processing step of forming a tunnel magneto-resistive effect film by sequentially forming a magnetic pinned layer, a tunnel barrier layer, and a memory layer;

a processing step of forming a top-coating layer and a plate foundation layer on said tunnel magneto-resistive effect film;

a processing step of forming a resist film on said plate foundation layer;

a processing step of forming an aperture portion having a shape identical to that of a shape of element through said resist film;

a processing step of forming a plated layer by selectively growing said plated layer on said plate foundation layer inside of said aperture portion by applying a plating process;

a processing step of removing said resist film;

a processing step of forming a magneto-resistive effect element by processing from said plate foundation layer up to said memory layer by utilizing said plated layer as a mask layer;

a processing step of forming an insulating film for covering said tunnel magneto-resistive effect element together with said plated layer; and a processing step of leveling off the surface of said insulating film and exposing an upper surface of said plated layer at a surface of said insulating film.

* * * * *